US006476614B1

(12) United States Patent
Hashimoto et al.

(10) Patent No.: US 6,476,614 B1
(45) Date of Patent: Nov. 5, 2002

(54) DETECTOR FOR DETECTING FREQUENCIES IN MORE THAN ONE BAND

(75) Inventors: Koji Hashimoto, Hyogo; Hiroshi Takahashi; Yuki Satoh, both of Osaka, all of (JP)

(73) Assignee: Matsushita Electric Industrial Co., Ltd, Osaka (JP)

( * ) Notice: Subject to any disclaimer, the term of this patent is extended or adjusted under 35 U.S.C. 154(b) by 0 days.

(21) Appl. No.: 09/581,882

(22) PCT Filed: Oct. 25, 1999

(86) PCT No.: PCT/JP99/05869

§ 371 (c)(1),
(2), (4) Date: Sep. 11, 2000

(87) PCT Pub. No.: WO00/25383

PCT Pub. Date: May 4, 2000

(30) Foreign Application Priority Data

Oct. 27, 1998 (JP) .......................................... 10-304863

(51) Int. Cl.[7] ............................................... G01R 31/08
(52) U.S. Cl. ...................................... 324/525; 333/111
(58) Field of Search .................. 324/525; 455/101–103, 455/126, 127, 552–553; 330/129, 286; 333/111

(56) References Cited

FOREIGN PATENT DOCUMENTS

| | | |
|---|---|---|
| EP | 0 859 464 | 8/1998 |
| JP | 59-169203 | 9/1984 |
| JP | 3-40504 | 2/1991 |
| JP | 5-14019 | 1/1993 |
| JP | 6-303036 | 10/1994 |
| JP | 6-334401 | 12/1994 |
| JP | 10-233624 | 9/1998 |

OTHER PUBLICATIONS

Search Report corresponding to application No. PCT/JP99/05869 dated Dec. 28, 1999.

Supplementary European Search Report # 19008–50 corresponding to application No. EP 99 94 9390 dated May 3, 2001.

*Primary Examiner*—N. Le
*Assistant Examiner*—Amy He
(74) *Attorney, Agent, or Firm*—RatnerPrestia

(57) ABSTRACT

A detector detects frequencies in two predetermined bands separately with respective predetermined coupling. The detector includes a first transmission line, and second and third transmission lines and disposed near the first transmission line. One end of the first transmission line is connected to a terminating resistor, and the other end of the first transmission line is connected to an anode terminal of a detecting diode through a wideband matching circuit. A cathode terminal of the detecting diode is connected to a load circuit.

7 Claims, 2 Drawing Sheets

DETECTOR FOR DETECTING FREQUENCIES IN MORE THAN ONE BAND

This Application is a U.S. National Phase Application of PCT International Application PCT/JP99/05869.

FIELD OF THE INVENTION

The present invention relates to the field of detectors used for monitoring the output power of radio devices, typically mobile communications equipment.

BACKGROUND OF THE INVENTION

Rapid expansion is taking place in the mobile communications field, and the sudden increase in number of users has led to the mixed use of multiple systems. Accordingly, a composite terminal that accepts multiple systems is desirable for radio devices for monitoring the output power of individual systems separately.

On the other hand, further downsizing is desirable for radio circuits in the mobile communications field, increasing the need for unifying individual detectors used in multiple systems to reduce the detector size.

SUMMARY OF THE INVENTION

The detector of the present invention includes a first transmission line, a second transmission line disposed near the first transmission line, and a third transmission line disposed near the first transmission line. A terminating resistor is connected to one end of the first transmission line, and the other end of the first transmission line is connected to an anode terminal of a detecting diode through a wideband matching circuit. A cathode terminal of the detecting diode is connected to a load circuit.

The above configuration enables to detect two predetermined frequency bands separately with predetermined coupling for realizing a small wideband detector.

DESCRIPTION OF THE PREFERRED EMBODIMENT

Figure 1:
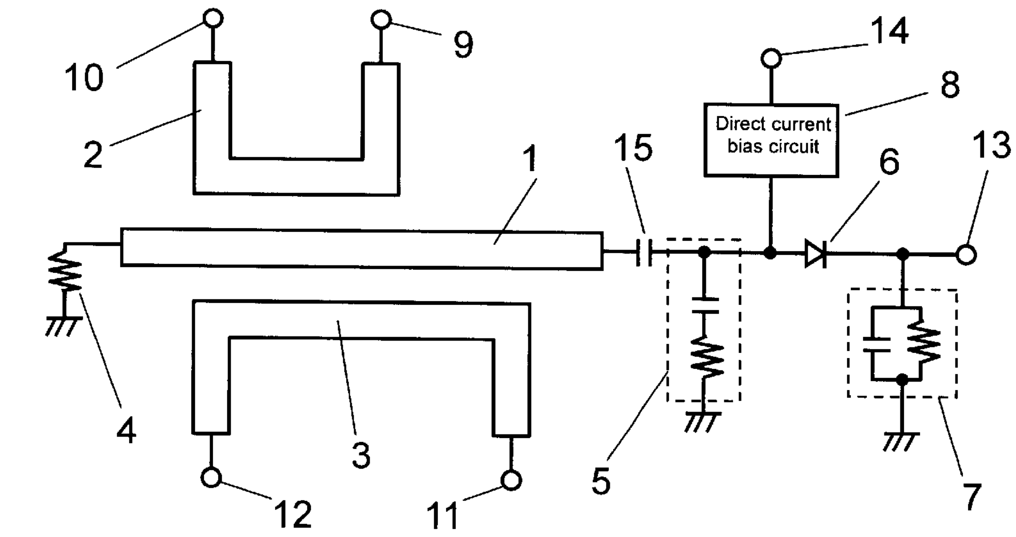
FIG. 1 is a block diagram illustrating a circuit configuration of a detector in accordance with a first exemplary embodiment of the present invention.

A detector of the present invention includes a first transmission line, a second transmission line disposed near the first transmission line, and a third transmission line disposed near the first transmission line. A terminating resistor is connected to one end of the first transmission line, and the other end of the first transmission line is connected to an anode terminal of a detecting diode through a wideband matching circuit. A cathode terminal of the detecting diode is connected to a load circuit. This configuration enables to detect power of two signals separately.

It is preferable to dispose the first transmission line between the second and third transmission lines. This allows to minimize the length of the first transmission line for detecting power of two signals separately.

It is further preferable to employ a strip line for the first, second, and third transmission lines. This facilitates adjustment of coupling between the first and second transmission lines, and between the first and third transmission lines.

It is also further preferable to employ a strip line for the first, second, and third transmission lines; and at the same time, to provide that a length of said second transmission line adjacent to said first transmission line and a length of said third transmission line adjacent to said first transmission line is different. This enables to detect power of signals in two predetermined frequency bands separately.

It is further preferable to employ a direct current blocking capacitor and resistor for the wideband matching circuit. This enables to match impedance at extremely wide band.

It is further preferable to dispose the first, second, and third transmission lines on the rear face of a multilayer circuit board, and the detecting diode and wideband matching circuit on the surface; and cover the entire surface with a shield case. Protrusions are created from the shield case to the rear face for reducing the size. This avoids a direct contact of the first, second, and third transmission lines disposed on the rear face with a motherboard, enabling to achieve stable characteristics.

It is further preferable to dispose the first, second, and third transmission lines on the rear face of a multilayer circuit board, and the detecting diode and wideband matching circuit on the surface. The thickness of the first, second, and third transmission lines are made thinner than the thickness of an input and output terminal disposed on the rear face for reducing the size. This avoids a direct contact of the first, second, and third transmission lines disposed on the rear face with a motherboard, enabling to achieve stable characteristics.

It is further preferable to dispose the terminating resistor, load resistor, and direct current bias resistor on the rear face of the multilayer circuit board, and the first, second, and third transmission lines, wideband matching circuit, and detecting diode on the surface for reducing the size. This enables to achieve stable characteristics, even if the detector is mounted in a direct contact with a motherboard.

It is further preferable to connect a cathode terminal of a second detecting diode to an anode terminal of the detecting diode, and ground an anode terminal of the second detecting diode. This enables to double the detected output voltage.

It is further preferable to provide the terminating resistor, load resistor, and direct current bias resistor with a printing resistor. This enables to reduce the height of the detector.

It is still further preferable to set characteristic impedance of the first transmission line to 50 Ω or above. This enables to increase the output voltage of the detector.

First Exemplary Embodiment

FIG. 1 is a block diagram illustrating a circuit configuration of a detector in a first exemplary embodiment of the present invention.

In FIG. 1, a first transmission line 1 is interposed between a second transmission line 2 and third transmission line 3. The first transmission line is coupled to the second transmission line 2 with a length of approximately ¼ wavelength of the first frequency, and the first transmission line 1 is coupled to the third transmission line 3 with a length of approximately ¼ wavelength of the second frequency. The transmission lines configure parallel coupling lines with each distance satisfying predetermined coupling for each of the first and second frequencies. One end of the first transmission line 1 is terminated at the terminating resistor 4, and the other end of the first transmission line 1 is connected to the wideband matching circuit 5 through a capacitor 15. The wideband matching circuit 5 is configured with a series circuit of a direct current blocking capacitor and resistor. One end of the wideband matching circuit 5 is connected to the anode terminal of the detecting diode 6, and a load circuit 7 is connected to the cathode terminal of the detecting diode 6. The load circuit 7 is configured with a parallel circuit of a resistor and high frequency grounding capacitor. A direct current bias circuit 8 is connected to the anode terminal of the detecting diode 6.

Downsizing and detection operation of frequency signals in two predetermined bands are described next.

Signals input from an RF input terminal 9 are output to an RF output terminal 10. At the same time, power is transmitted to the first transmission line I at coupling in accordance with distance and length of a portion of the second transmission line 2 parallel to the first transmission line 1. The transmitted power is input to the detecting diode 6 through the wideband matching circuit 5 for rectification, and then a voltage corresponding to the resistor of the load circuit 7 is output from a detecting output terminal 13. The high frequency grounding capacitor of the load circuit 7 acts to remove the RF component in the cathode terminal of the detecting diode 6. A low DC current is fed from a direct current bias terminal 14 to the detecting diode 6 through the direct current bias circuit 8 to avoid the use of the startup portion of the voltage-current characteristics of the detecting diode 6. This makes it possible to improve its temperature characteristics. In the same way, signals input from an RF input terminal 11 are output to an RF output terminal 12, and also the detected voltage is output from the detecting output terminal 13 through the first transmission line 1.

Lengths and distances of portions of the second transmission line 2 and third transmission line 3 parallel to the first transmission line are independently settable. This makes it possible to input frequency signals in two predetermined bands to the RF input terminal 9 and RF input terminal 11. Accordingly, signals may be transmitted to the first transmission line 1 at predetermined coupling for each frequency. In addition, since the second transmission line 2 and the third transmission line 3 are disposed on both sides of the first transmission line 1, the second transmission line 2 and third transmission line 3 do not mutually interfere, making it possible to easily obtain the desired characteristic impedance.

Moreover, since the first transmission line 1 is disposed between the second transmission line 2 and third transmission line 3, the length of the first transmission line may be minimized, thus reducing the size of the detector.

Furthermore, configuration of the wideband matching circuit 5 with the direct current blocking capacitor and resistor achieves an extremely small change in impedance with frequency, thus making impedance matching in an ultra wide band across an octave or above achievable, and enabling the output of an equivalent detected voltage for frequencies in both predetermined bands transmitted to the first transmission line 1.

Second Exemplary Embodiment

Figure 2:
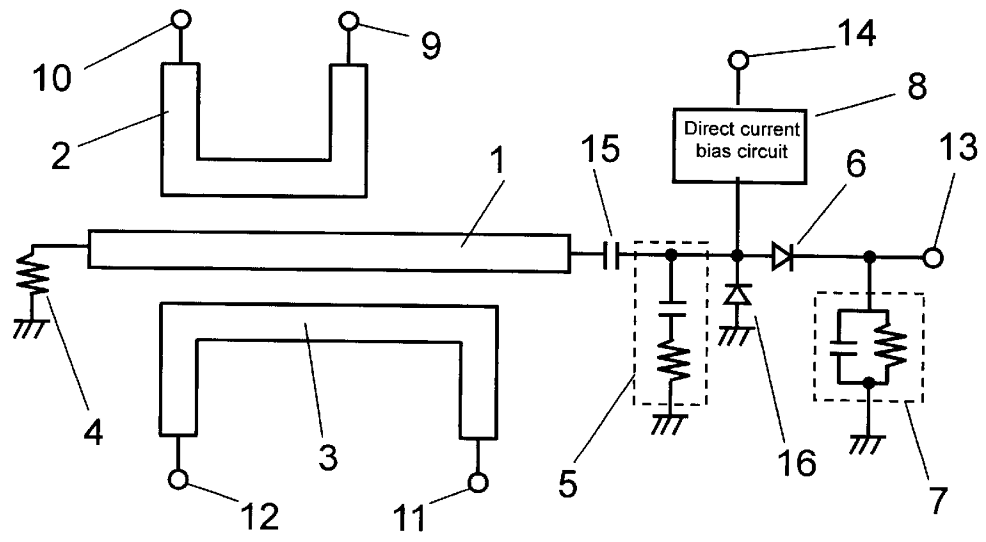
FIG. 2 is a block diagram illustrating a circuit configuration of a detector in accordance with a second exemplary embodiment of the present invention.

FIG. 2 is a block diagram illustrating a circuit configuration of a detector in a second exemplary embodiment of the present invention.

In FIG. 2, a cathode terminal of a second detecting diode 16 is connected to the anode terminal of the detecting diode 6, and an anode terminal of the second detecting diode 16 is grounded. This configuration enables the detection of both upper and lower waves in the AC component. Accordingly, the output voltage at the detecting output terminal 13 may be approximately doubled.

If the wideband matching circuit 5 is configured with a capacitor and an inductor, the applicable band may be narrowed compared to that configured with the direct current blocking capacitor and resistor shown in FIGS. 1 and 2. However, the loss may be reduced for increasing the detected output voltage.

Unless there is a concern about temperature characteristics, the direct current bias circuit 8 is not particularly necessary.

Third Exemplary Embodiment

Figure 3:
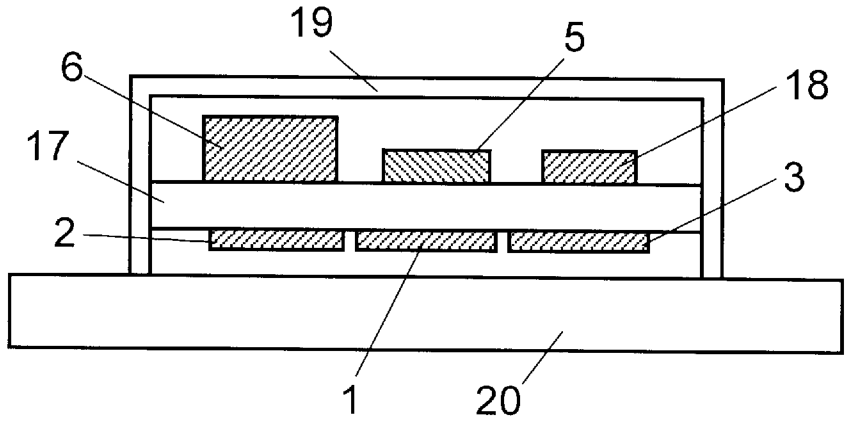
FIG. 3 is a configuration of the detector in accordance with the first and second exemplary embodiments of the present invention.

FIG. 3 shows the configuration of the detector described in the first and second exemplary embodiments of the present invention.

In FIG. 3, the first, second, and third transmission lines 1, 2, and 3 are formed on the rear face of a multilayer circuit board 17 such as by printing and etching. The detecting diode 6, terminating resistor 4, wideband matching circuit 5, load circuit 7, resistor and capacitor 18 of the direct current bias circuit 8 are mounted on the surface of the multilayer circuit board 17. The use of both faces of the multilayer circuit board 17 achieves downsizing and a high degree of separation between the RF unit and the detector circuit unit (configured with wideband matching circuit 5, detecting diode 6, load circuit 7, and direct current bias circuit 8). In addition, a shield case 19 covers the surface side of the multilayer circuit board 17. The shield case 19 has a projection to the rear face of the multilayer circuit board 17 so that the first, second and third transmission lines 1, 2, and 3 disposed on the rear face of the multilayer circuit board 17 do not directly contact a motherboard 20 when the detector is mounted on the motherboard 20. This avoids the addition of unwanted stray capacity among the first, second, and third transmission lines 1, 2, and 3, stabilizing coupling quantity and in turn stabilizing the detection characteristics.

Fourth Exemplary Embodiment

Figure 4:
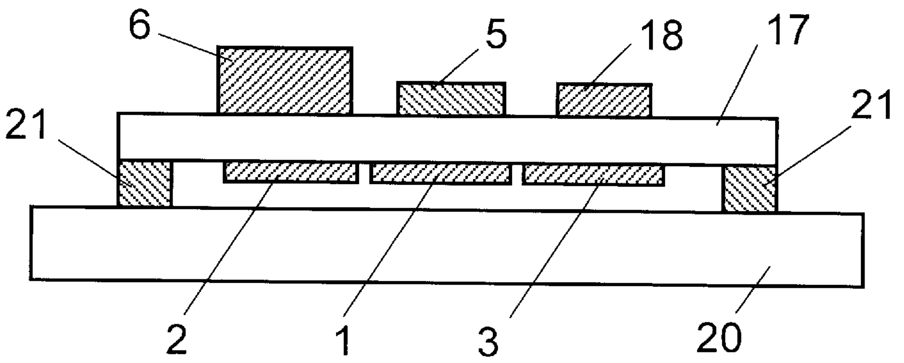
FIG. 4 is another configuration of the detector in accordance with the first and second exemplary embodiments of the present inventions.

FIG. 4 shows another configuration of the detector described in the first and second exemplary embodiments of the present invention.

In FIG. 4, the first, second, and third transmission lines 1, 2, and 3 are formed on the rear face of the multilayer circuit board 17 such as by printing and etching. The detecting diode 6, terminating resistor 4, wideband matching circuit 5, load circuit 7, resistor and capacitor 18 of the direct current bias circuit 8 are mounted on the surface of the multilayer circuit board 17. The use of both faces of the multilayer circuit board 17 achieves downsizing and a high degree of separation between the RF unit and the detector circuit unit. In addition, the thickness of an input and output terminal 21 (RF input terminals 9 and 11, etc.) formed on the rear face of the multilayer circuit board 17 is made thicker than the thickness of the first, second, and third transmission lines 1, 2, and 3. This avoids a direct contact of the first, second, and third transmission lines 1, 2, and 3 disposed on the rear face of the multilayer circuit board 17 to the motherboard 20 when the detector is mounted on the motherboard 20. Accordingly, no unwanted stray capacity is added among the first, second, and third transmission lines 1, 2, and 3, stabilizing coupling quantity, and in turn stabilizing the detection characteristics.

Fifth Exemplary Embodiment

Figure 5:
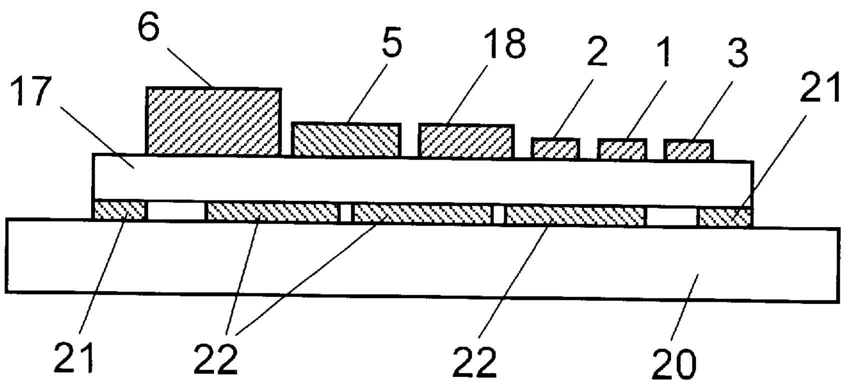
FIG. 5 is another configuration of the detector in accordance with the first and second exemplary embodiments of the present invention.

FIG. 5 shows another configuration of the detector described in the first and second exemplary embodiments of the present invention.

In FIG. 5, a resistor 22 (such as the terminating resistor 4 and resistor etc. in the wideband matching circuit 5, load circuit 7, and direct current bias circuit 8) is mounted on the rear face of the multilayer circuit board 17 such as by printing. The first, second and third transmission lines 1, 2, and 3, detecting diode 6, wideband matching circuit 5, load circuit 7, capacitor 18 of the direct current bias circuit 8 are formed on the surface of the multilayer circuit board 17. The use of both faces of the multilayer circuit board 17 achieves downsizing of the detector. Only the resistor 22 is formed on the rear face of the multilayer circuit board 17, and the first, second, and third transmission lines 1, 2, and 3 handling high frequency signals are formed on the surface. This enables to avoid changes in coupling quantity among the first, second, and third transmission lines 1, 2, and 3 even the detector is mounted in a direct contact with the motherboard 20, stabilizing characteristics.

In FIG. 5, the resistor 22 is printed to avoid substantial increase in the thickness of the detector, realizing the detector with shorter height.

The characteristic impedance of the first transmission line 1 in the first to fifth exemplary embodiments is 50 Ω or above, for example such as from 100 to 2000 Ω. This allows to set high impedance for the wideband matching circuit for increasing the output voltage at the detecting output terminal 13.

Industrial Applicability

The detector of the present invention includes a first transmission line, a second transmission line disposed near the first transmission line, and a third transmission line disposed near the first transmission line. The terminating resistor is connected to one end of the first transmission line, and the other end of the first transmission line is connected to the anode terminal of the detecting diode through the wideband matching circuit. The load circuit is connected to the cathode terminal of the detecting diode. This configuration offers a small detector which has predetermined coupling quantity for each of two bands for detecting frequencies in two predetermined bands separately.

What is claimed is:

1. A detector for detecting frequencies of more than one band, said detector comprising:

a first transmission line, a second transmission line, and a third transmission line configured with a strip line;

said first transmission line disposed between said second and third transmission lines;

a length of said second transmission line parallel to said first transmission line and a length of said third transmission line parallel to said first transmission line being different;

one end of said first transmission line being coupled to a terminating resistor, another end of said first transmission line being coupled to an anode terminal of a detecting diode through an end of a wideband matching circuit;

a cathode terminal of said detecting diode being coupled to a load circuit; and input terminals and output terminals at each end of said second and said third transmission lines, respectively wherein said first, second, and third transmission lines and said input and output terminal at each end of said second and said third transmission lines are formed on a first face of a multilayer circuit board; said detecting diode and said wideband matching circuit are formed on a second surface of said multilayer circuit board; and thicknesses of said first, second, and third transmission lines are thinner than thickness of at least one of said input and output terminals.

2. The detector as defined in claim 1, wherein said wideband matching circuit includes a direct current blocking capacitor and a resistor.

3. The detector as defined in claim 1, wherein said first, second, and third transmission lines are formed on a first face of a multilayer circuit board; and said detecting diode and a wideband matching circuit are formed on a second face of said multilayer circuit board.

4. The detector as defined in claim 1, further comprising a second detecting diode, wherein a cathode terminal of said second detecting diode is coupled to an anode terminal of said detecting diode.

5. The detector as defined in claim 1, wherein characteristic impedance of said first transmission line is not less than 50 Ω.

6. A detector for detecting frequencies of more than one band, said detector comprising:

a first transmission line, a second transmission line, and a third transmission line configured with a strip line;

said first transmission line disposed between said second and third transmission lines;

a length of said second transmission line parallel to said first transmission line and a length of said third transmission line parallel to said first transmission line being different;

one end of said first transmission line being coupled to a terminating resistor, another end of said first transmission line being coupled to an anode terminal of a detecting diode through an end of a wideband matching circuit; and a cathode terminal of said detecting diode being coupled to a load circuit wherein said wide band matching includes a further resistor and wherein at least said terminating resistor, a load resistor of said load circuit, and said further resistor of said wideband matching circuit are formed on a first face of a multilayer circuit board, and said first, second, and third transmission lines, said wideband matching circuit, and said detecting diode are formed on a second face of said multilayer circuit board.

7. The detector as defined in claim 6, wherein said terminating resistor, said load resistor, and said further resistor are printed resistors.

* * * * *